United States Patent
Evans et al.

(10) Patent No.: US 9,177,635 B1
(45) Date of Patent: Nov. 3, 2015

(54) DUAL RAIL SINGLE-ENDED READ DATA PATHS FOR STATIC RANDOM ACCESS MEMORIES

(71) Applicant: LSI Corporation, San Jose, CA (US)

(72) Inventors: Donald Albert Evans, Carroll, OH (US); Rasoju Veerabadra Chary, Bangalore (IN); Rajiv Kumar Roy, Bangalore (IN); Rahul Sahu, Bangalore (IN)

(73) Assignee: Avago Technologies General IP (Singapore) Pte Ltd, Singapore (SG)

( * ) Notice: Subject to any disclaimer, the term of this patent is extended or adjusted under 35 U.S.C. 154(b) by 0 days.

(21) Appl. No.: 14/259,994

(22) Filed: Apr. 23, 2014

(30) Foreign Application Priority Data

Apr. 9, 2014 (IN) .............................. 447/KOL/2014

(51) Int. Cl.
*G11C 11/00* (2006.01)
*G11C 11/419* (2006.01)
*G11C 5/06* (2006.01)

(52) U.S. Cl.
CPC .............. *G11C 11/419* (2013.01); *G11C 5/063* (2013.01)

(58) Field of Classification Search
USPC ................... 365/154, 189.11, 189.15, 230.06
See application file for complete search history.

(56) References Cited

U.S. PATENT DOCUMENTS

| | | | | |
|---|---|---|---|---|
| 5,025,422 A | * | 6/1991 | Moriwaki et al. | 365/233.5 |
| 7,161,868 B2 | * | 1/2007 | Morishima | 365/230.05 |
| 7,508,697 B1 | * | 3/2009 | Mukhopadhyay et al. | 365/154 |
| 7,830,727 B2 | | 11/2010 | Arsovski et al. | |
| 8,279,687 B2 | * | 10/2012 | Adams et al. | 365/189.11 |
| 8,520,454 B2 | * | 8/2013 | Ouchi | 365/189.15 |

OTHER PUBLICATIONS

Daya et al., Synchronous 16x8 SRAM Design, Electrical Engineering Department, University of Florida.
Singh et al., Single Ended 6T SRAM with Isolated Read-Port for Low-Power Embedded Systems; 978-3-9810801-5, 2009.

* cited by examiner

*Primary Examiner* — Pho M Luu
(74) *Attorney, Agent, or Firm* — Duft Bornsen & Fettig, LLP (57) ABSTRACT

Single-ended read circuits for SRAM devices are disclosed for high performance sub-micron designs. One embodiment is an SRAM device that includes a memory cell array and a bit line traversing the memory cell array for reading data from memory cells of the memory cell array. A read circuit coupled to the bit line translates data stored in a memory cell from a cell voltage of the memory cells to a peripheral voltage of an output of the SRAM device while bypassing a level shifter in the read data path.

11 Claims, 7 Drawing Sheets

DUAL RAIL SINGLE-ENDED READ DATA PATHS FOR STATIC RANDOM ACCESS MEMORIES

CROSS REFERENCE TO RELATED APPLICATIONS

This document claims priority to Indian Patent Application Number 447/KOL/2014 filed on Apr. 9, 2014 (entitled DUAL RAIL SINGLE-ENDED READ DATA PATHS FOR STATIC RANDOM ACCESS MEMORIES) which is hereby incorporated by reference.

FIELD OF THE INVENTION

The invention generally relates to field of read data paths for memory devices.

BACKGROUND

Sub-micron Integrated Circuit (IC) designs often utilize a number of different power supplies to reduce power consumption and to improve performance. For example, in sub-micron Static Random Access Memories (SRAM) devices, lower voltage supplies may be utilized for the memory cells to improve the dynamic power consumption, while peripheral circuits to the memory cells may utilize high voltage supplies for interfacing the SRAM device to external circuits. Level shifters are used to translate the logic level range of the SRAM cells to the logic level range of the peripheral circuits. However, level shifters in the data path between the SRAM cells and the peripheral circuits may introduce delays in reading data from the SRAM cells, which degrades the performance of the SRAM device.

SUMMARY

Single-ended read circuits for SRAM devices are disclosed for high performance sub-micron designs. One embodiment is an SRAM device. The SRAM device includes a memory cell array and a bit line traversing the memory cell array for reading data from memory cells of the memory cell array. The SRAM device further includes a read circuit coupled to the bit line for translating data stored in a memory cell from a cell voltage of the memory cells to a peripheral voltage of an output of the SRAM device. The cell voltage and the peripheral voltage share a common ground. The read circuit comprises a data path circuit that is configured to toggle a first internal signal between a logical zero of the peripheral voltage and a logical one of the peripheral voltage based on read data on the bit line and a second internal signal. The data path circuit is further configured to toggle a third internal signal between a logical zero of the cell voltage and a logical one of the cell voltage based on an enable signal and the read data on the bit line. The read circuit further comprises a level shifter that is configured to toggle the second internal signal between a logical zero of the peripheral voltage and a logical one of the peripheral voltage based on the read data on the bit line and a reset signal. The read circuit further comprises an output driver that is configured to toggle the output of the SRAM device between a logical zero of the peripheral voltage and a logical one of the peripheral voltage based on the first internal signal.

The various embodiments disclosed herein may be implemented in a variety of ways as a matter of design choice. For example, some embodiments herein are implemented in hardware whereas other embodiments may include processes that are operable to construct and/or operate the hardware. Other exemplary embodiments are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below.

Figure 1:
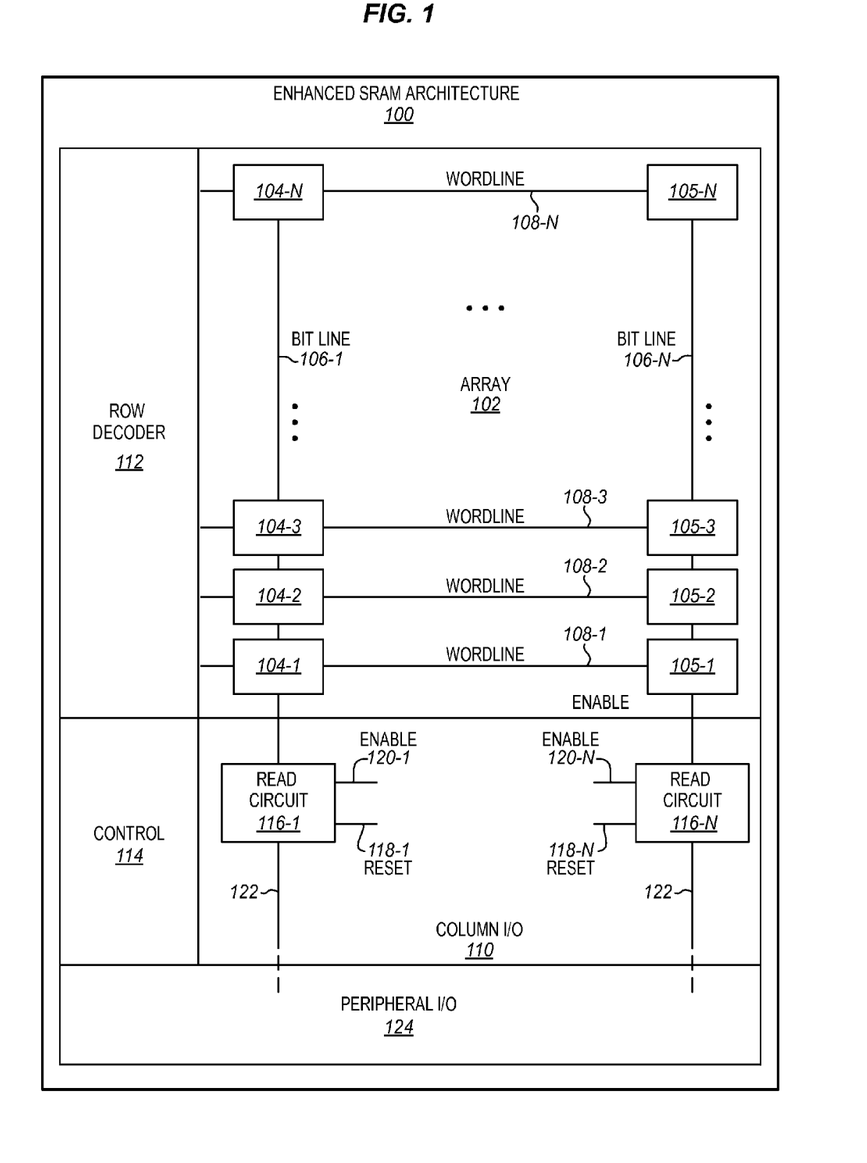
FIG. 1 is a block diagram of an enhanced SRAM architecture in an exemplary embodiment.

FIG. 1 is a block diagram of an enhanced SRAM architecture 100 in an exemplary embodiment. Architecture 100 is a simplified block diagram view that will be used to discuss the inventive aspects of the SRAM devices disclosed herein. But, architecture 100 is not intended to limit the implementation to any particular embodiment. Those skilled in the art will understand that additional components not shown or described in FIG. 1, such as drivers, latches, decoders, sense amps, etc. may be used to implement architecture 100 in various configurations as a matter of design choice.

Architecture 100 in this embodiment includes an array 102 of memory cells 104-105. Memory ells 104-105 are disposed in array 102 at the intersections of column bit lines and row word lines within array 102. For instance, memory cell 104-1 is disposed in array 102 where bit line 106-1 intersects word line 108-1. To access memory cell 104-1, word line 108-1 is asserted utilizing a row decoder circuit 112, and bit data stored at memory cell 104-1 is read out by bit line 106 utilizing a read circuit 116-1. In this embodiment, memory cells 104-105 operate at a different voltage range than peripheral I/O 110. For example, memory cells 104-105 may operate at a lower voltage than peripheral I/O 110 in order to improve the dynamic power of architecture 100. Thus, part of the read activity of memory cells 104-105 involves translating bit data stored by memory cells 104-105 from the voltages used to store bit data in the memory cells (referred to herein as cell voltage) to the voltages used to generate an OUTPUT 122 from read circuit 116 for the bit data (referred to herein as peripheral voltage). In this embodiment, architecture 100 utilizes a single-ended read data path from cells 104-105, and therefore, only one bit line 106 is used to read data from a particular memory cell.

In this embodiment, read circuit 116-1 is coupled with bit line 106-1, and read circuit 116-N is coupled with bit line 106-N. However, in other embodiments, multiple bit lines 106 may be multiplexed together before routing to read circuit 116. For instance, some subset of the total number of bit lines 106 may be multiplexed together (e.g., 8 bit lines) before routing the output of the multiplexer to a particular instance of read circuit 116. Out of the n-multiplexed bit lines, one bit line is selected based on pre-decode signals. Although not shown in FIG. 1, memory cells 104-105 may utilize a bistable latch circuit to store a bit of data (e.g., a 6 transistor SRAM cell), although the particular implementation of memory cells 104-105 is a matter of design choice.

In this embodiment, read circuit 116 does not include level shifters in the read data path between memory cells 104-105 and OUTPUT 122 of read circuit 116, although read circuit 116 is capable of translating bit data stored by memory cells 104-105 from the cell voltages of the memory cells 104-105 to the peripheral voltage of OUTPUT 122. This reduces the delay along the read data path between memory cells 104-105 and OUTPUT 122, and improves the read performance of architecture 100. The specifics of how read circuit 116 may operate will become more readily apparent in discussing FIGS. 2-7

Figure 2:
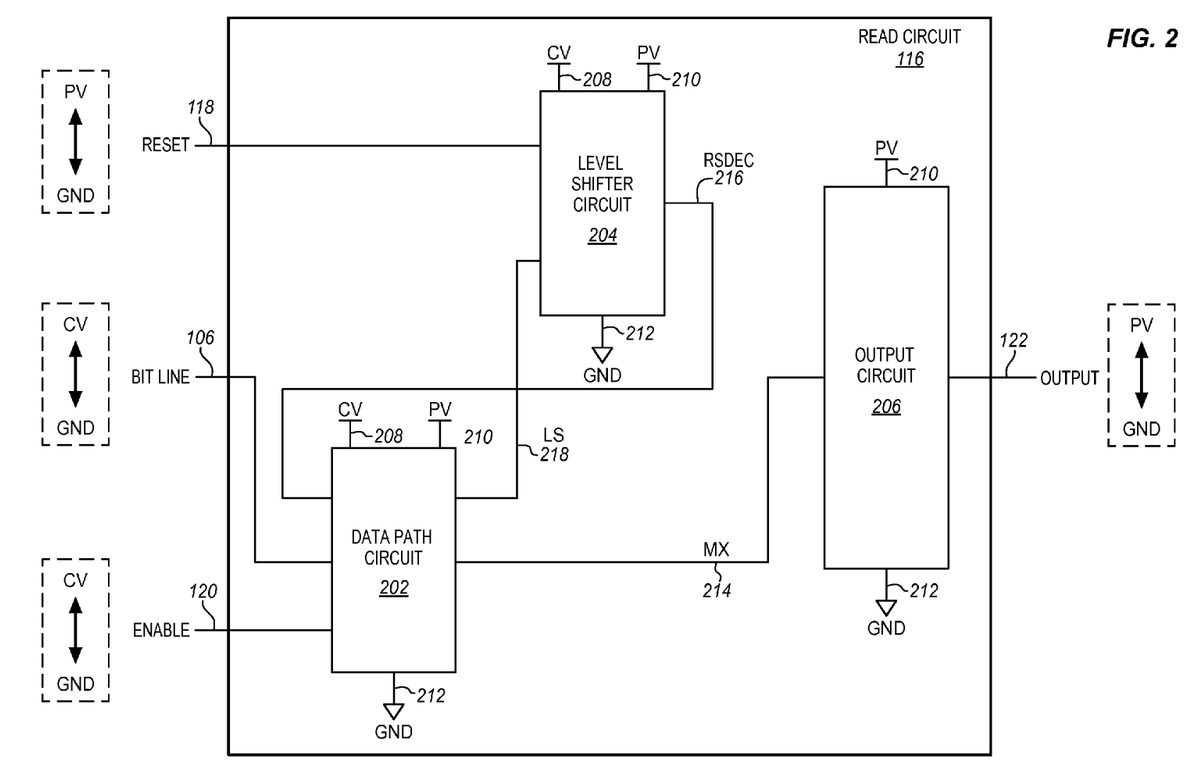
FIG. 2 is a block diagram of a single-ended SRAM read circuit for translating data stored in a memory cell from a cell voltage of the memory cell to a peripheral voltage in an exemplary embodiment.

FIG. 2 is a block diagram of a single-ended SRAM read circuit for translating data stored in a memory cell from a cell voltage of the memory cell to a peripheral voltage in an exemplary embodiment. In this embodiment, read circuit 116 includes a data path circuit 202, a level shifter circuit 204, and an output circuit 206. Generally, read circuit 116 translates memory cell data read by bit line 106 from cell voltage 208 to peripheral voltage 210. Data path circuit 202 is coupled to cell voltage 208, peripheral voltage 210, and a common ground 212, and toggles an MX signal 214 that is used by output circuit 206 to generate OUTPUT 122. In particular, data path circuit 202 includes any component or device that is able to toggle MX 214 between ground 212 (a logical zero or low) and peripheral voltage 210 (a logical one or high) based on a read signal on bit line 106 (e.g., data read from a memory cell, which may be a logical zero at approximately ground 212 or a logical one at approximately cell voltage 208) and an RSDEC signal 216. Data path circuit 202 also toggles an LS signal 218 that is used by level shifter circuit 204 to generate RSDEC 216. In particular, data path circuit 202 includes any component or device that is able to toggle LS 218 between ground 212 (a logical zero or low) and peripheral voltage 210 (a logical one or high) based on an ENABLE signal 120 and read data on bit line 106. Both ENABLE 120 and the signals on bit line 106 toggle between a logical zero at approximately ground 212 and a logic one at approximately cell voltage 208.

Level shifter circuit 204 is coupled to cell voltage 208, peripheral voltage 210, and ground 212, and toggles RSDEC 216 that is used by data path circuit 202 to generate MX 214. In particular, level shifter circuit 204 includes any component or device that is able to toggle RSDEC 216 between ground 212 (a logical zero or low) and peripheral voltage 210 (a logical one or high) based on LS 218 and a RESET signal 118.

RESET 118 toggles between a logical zero at approximately ground 212 and a logical one at approximately peripheral voltage 210.

Figure 3:
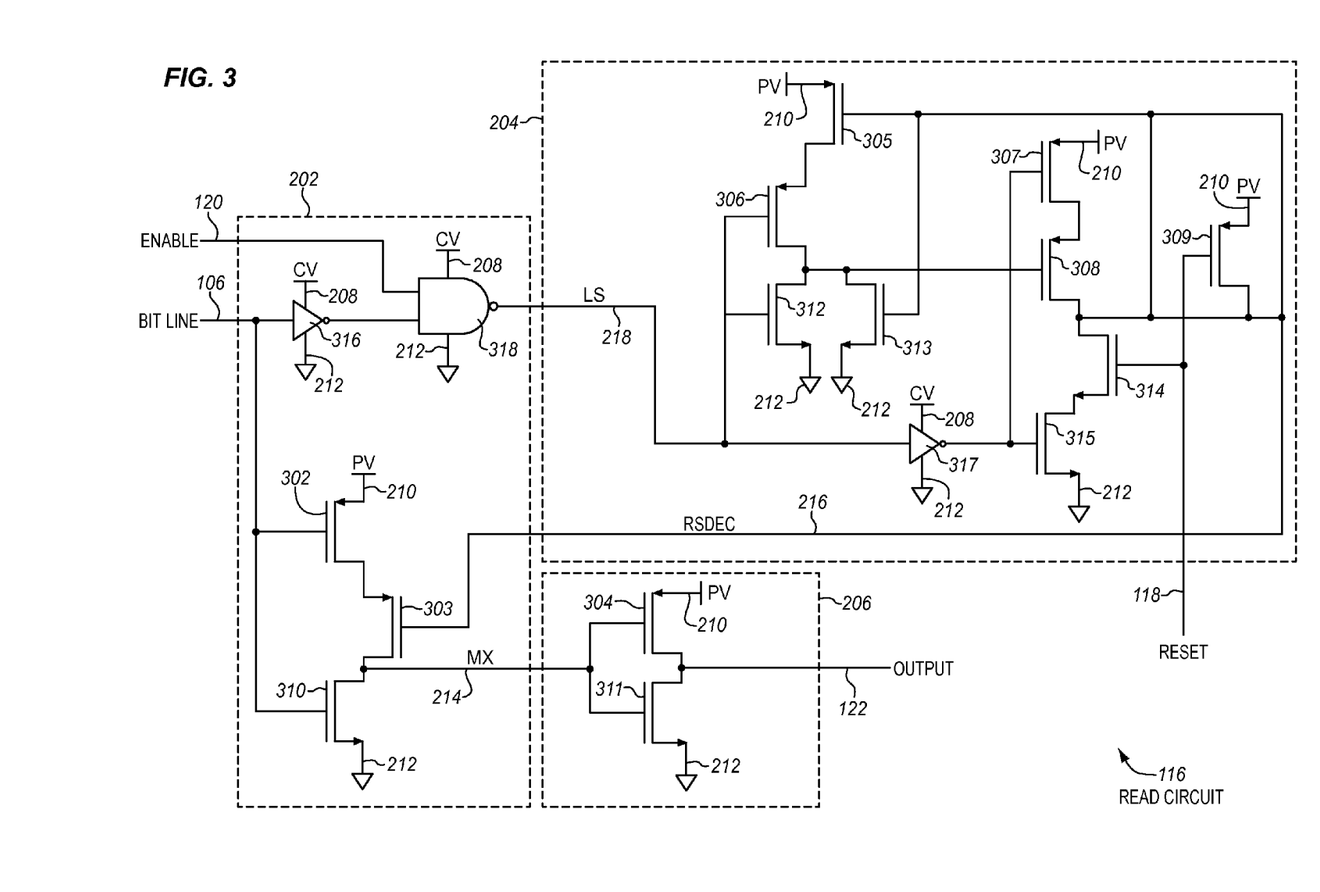
FIG. 3 is a schematic diagram of the read circuit of FIG. 2 in an exemplary embodiment.

FIG. 3 is a schematic diagram of read circuit 116 of FIG. 2 in an exemplary embodiment. In this embodiment, a number of Field-Effect Transistors (FETs) 302-315, inverters 316-317, and a NAND gate 318 are illustrated in a particular configuration for implementing the functionality previously described for read circuit 116 of FIG. 2. Generally, FETs 302-315 may include any type of field-effect transistor as a matter of design choice. One example of a FET is a Metal Oxide Semiconductor Field Effect Transistor (MOSFET). Although FIG. 3 illustrates one configuration of a number of FETs, inverters, and a NAND gate, one skilled in the art will understand other configurations may be implemented as a matter of design choice. Thus, it is not intended that read circuit 116 be limited to only the configuration and types of components illustrated in FIG. 3.

When ENABLE 120 is high and the read data on bit line 106 is low, NAND gate 318 sets LS 218 low. All other logic combinations of ENABLE 120 and the read data on bit line 106 set LS 218 high. With LS 218 low and RESET 118 high, FET 315 is on, and FET 314 is on. This discharged RSDEC 216 to ground 212. FET 306 and FET 305 are on, which turns off FET 308. FET 307 may be partially on due to the voltage differential between cell voltage 208 output by inverter 317 and peripheral voltage 210, but the gate on FET 308 is charged to peripheral voltage 210 so there is no leakage path between peripheral voltage 210 and ground 212. A low RSDEC 216 turns on FET 303 of data path circuit 202. With both FET 302 and FET 303 on, MX 214 charges to peripheral voltage 210. FET 304 and FET 311 of output circuit 206 invert MX 214 to set OUTPUT 122 low.

With ENABLE 120 high and the read data on bit line 106 high, NAND gate 318 sets LS 218 high. With LS 218 high, FET 312 is on, which turns on FET 308. FET 307 is on, which charges RSDEC 216 to peripheral voltage 210. FET 306 may be partially on due to the voltage differential between cell voltage 208 output by NAND gate 318 and peripheral voltage 210, but the gate on FET 305 is charged to peripheral voltage 210, so there is no leakage path from peripheral voltage 210 to ground 212. With RSDEC 216 at peripheral voltage 210 FET 303 in data path circuit 202 is off.

With FET 303 off and the read data on bit line 106 high, FET 310 is on, which pulls MX 214 low. Output circuit 206 inverts MX 214 and sets OUTPUT 122 high. For read circuit 116, accessing data stored by memory cells 104-105 occurs faster because there is not a voltage translation circuit in the data path between memory cells 104-105 and OUTPUT 122. This allows for reading data from memory cells 104-105 faster, which improves the performance of architecture 100.

In some embodiments, a latch circuit (not shown) may be coupled with MX 214 to latch MX 214 at the end of the read cycle for the memory cell. In those embodiments, the latch circuit may latch MX 214 when RESET 118 toggles from high to low.

Figure 4:
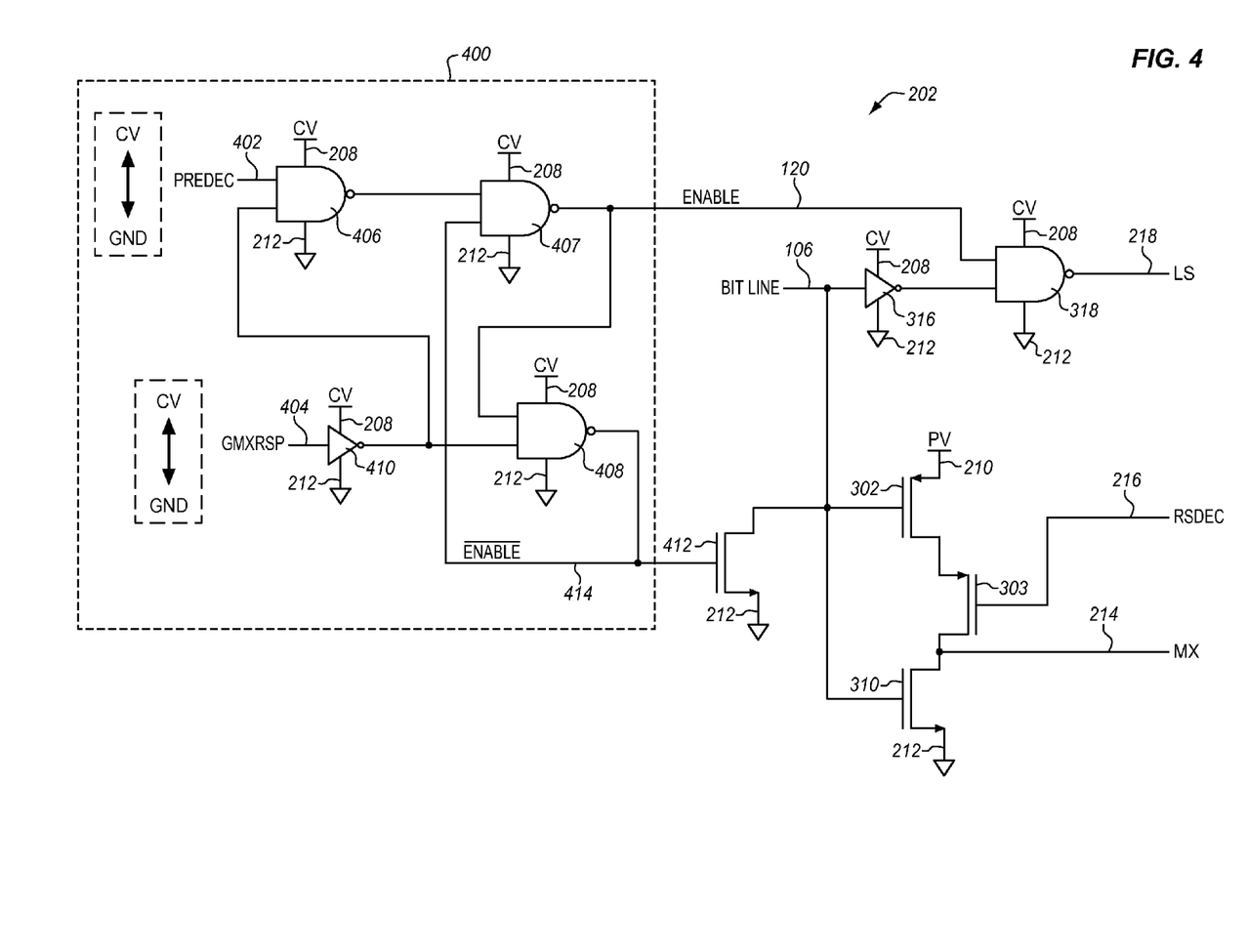
FIG. 4 is a schematic diagram of data path circuit 202 of FIG. 3 in another exemplary embodiment.

FIG. 4 is a schematic diagram of data path circuit 202 of FIG. 3 in another exemplary embodiment. In this embodiment, a decoder 400 is used to generate ENABLE 120, and a N-channel FET 412 has been added to data path circuit 202 of FIG. 3. FET 412 is utilized to ensure that bit line 106 is pulled low whenever ENABLE 120 is low. In this embodiment, decoder 400 generates ENABLE 120 based on a PREDEC signal 402 and a GMXRSP signal 403. PREDEC 402 may be a column select signal used to select which column to connect to bit line 106. GMXRSP signal 403 may be a tracking signal which tracks the reading and transfers the data onto bit line 106.

Figure 5:
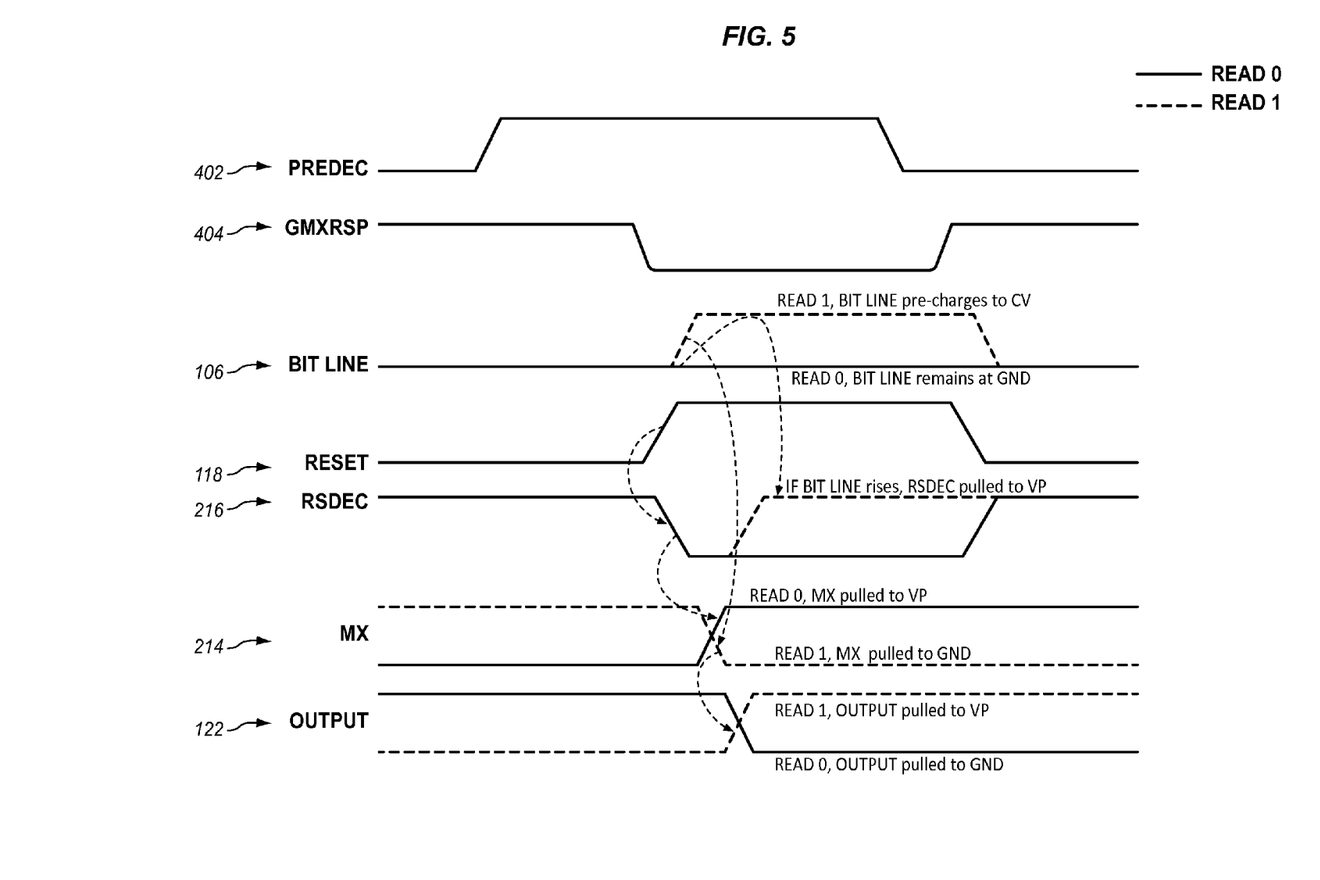
FIG. 5 is a timing diagram for the circuits of FIGS. 3-4 in an exemplary embodiment.

FIG. 5 is a timing diagram for the circuits of FIGS. 3-4 in an exemplary embodiment. FIG. 5 illustrates the various relationships between OUTPUT 122, MX 214, RESET 118, and RSDEC 216 based on the logical states of PREDEC 402, GMXRSP 404, and the read data applied to bit line 106.

Figure 6:
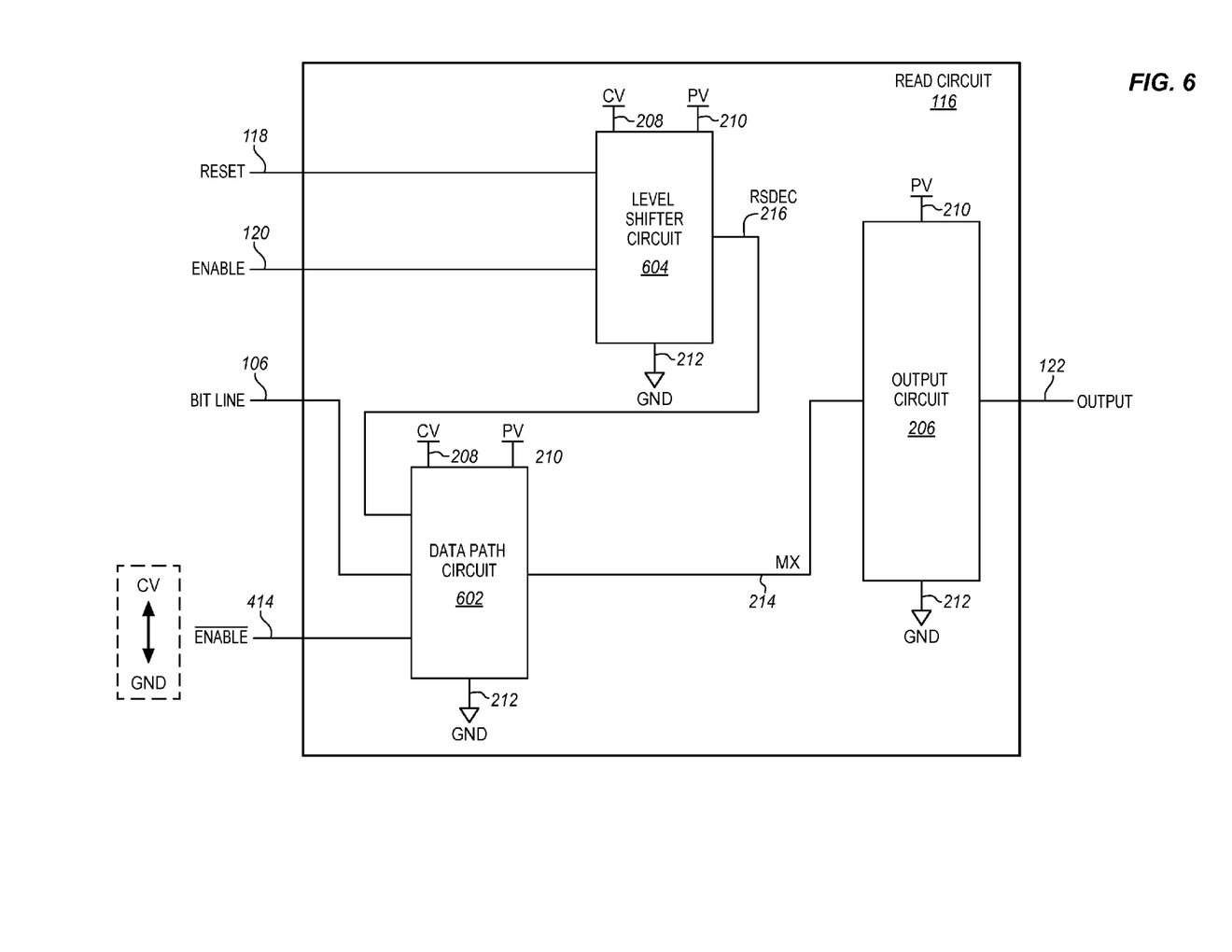
FIG. 6 is a block diagram of a single-ended SRAM read circuit for translating data stored in a memory cell from a cell voltage of the memory cell to a peripheral voltage in another exemplary embodiment.

FIG. 6 is a block diagram of a single-ended SRAM read circuit for translating data stored in a memory cell from a cell voltage of the memory cell to a peripheral voltage in another exemplary embodiment. In this embodiment, read circuit 116 includes a data path circuit 602, a level shifter circuit 604, and an output circuit 206. Generally, read circuit 116 translates memory cell data read by bit line 106 from cell voltage 208 to peripheral voltage 210. Data path circuit 602 is coupled to cell voltage 208, peripheral voltage 210, and a common ground 212, and toggles MX 214 that is used by output circuit 206 to generate OUTPUT 122. In particular, data path circuit 602 includes any component or device that is able to toggle MX 214 between ground 212 (a logical zero or low) and peripheral voltage 210 (a logical one or high) based on read data on bit line 106 (e.g., data read from a memory cell, which may be at a logical zero at approximately ground 212 or a logical one at approximately cell voltage 208), RSDEC 216, and a compliment of ENABLE 120, illustrated as $\overline{\text{ENABLE}}$ 414. Both $\overline{\text{ENABLE}}$ 414 and the read data on bit line 106 toggle between a logical zero at approximately ground 212 and a logic one at approximately cell voltage 208.

Level shifter circuit 604 is coupled to cell voltage 208, peripheral voltage 210, and ground 212, and toggles RSDEC 216 that is used by data path circuit 602 to generate MX 214. In particular, level shifter circuit 604 includes any component or device that is able to toggle RSDEC 216 between ground 212 (a logical zero or low) and peripheral voltage 210 (a logical one or high) based on a RESET 118 and ENABLE 120.

Figure 7:
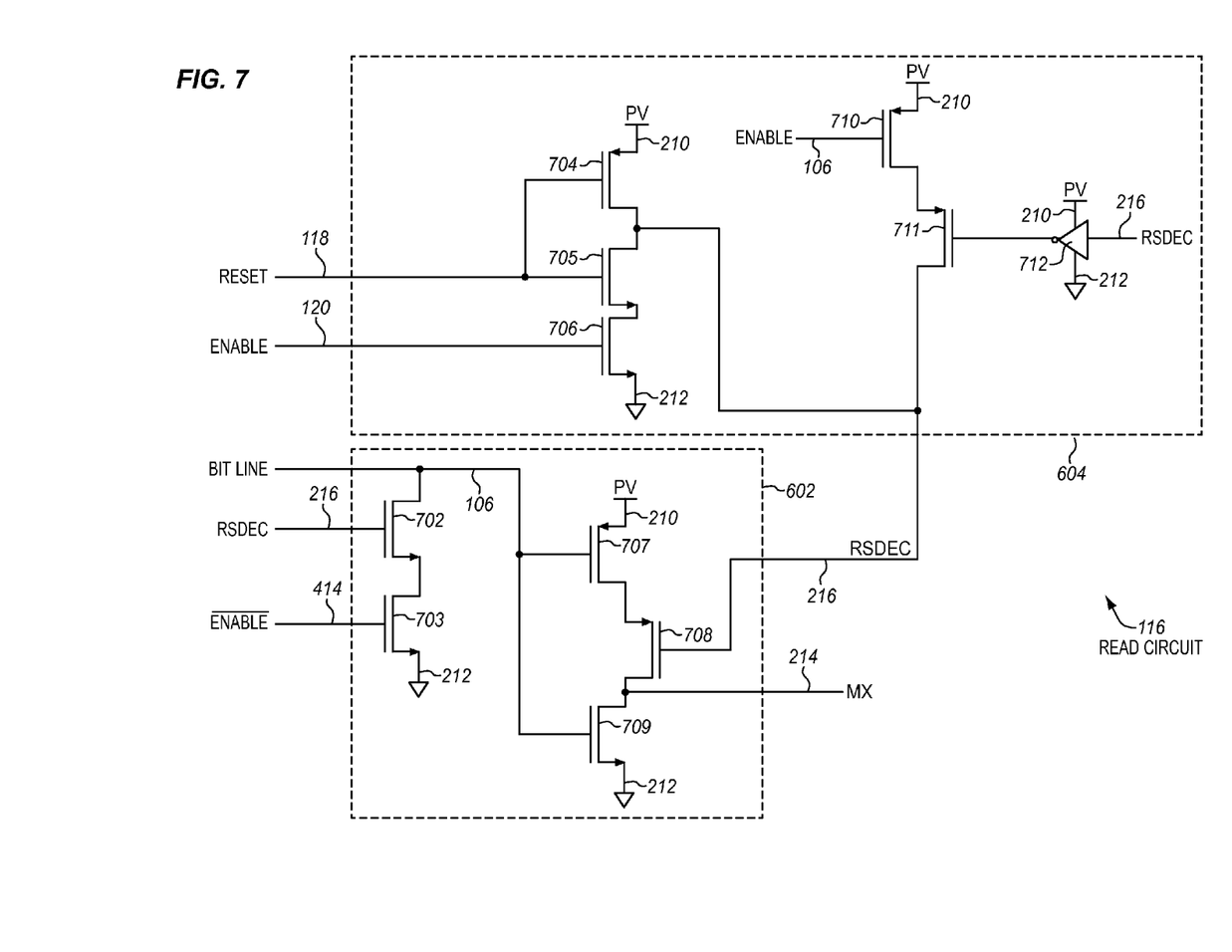
FIG. 7 is a schematic diagram of the read circuit of FIG. 6 in an exemplary embodiment.

FIG. 7 is a schematic diagram of read circuit 116 of FIG. 6 in an exemplary embodiment. In this embodiment, a number of FETs 702-711 and an inverter 712 are illustrated in a particular configuration for implementing the functionality previously described for read circuit 116 of FIG. 6. Generally, FETs 702-711 may include any type of field-effect transistor as a matter of design choice (e.g., MOSFET). Although FIG. 7 illustrates one configuration of a number of FETs and an inverter, one skilled in the art will understand other configurations may be implemented as a matter of design choice. Thus, it is not intended that read circuit 116 be limited to only the configuration and types of components illustrated in FIG. 7.

In this embodiment, when RESET 118 is high and ENABLE 120 is high, FETs 705-706 of level shifter circuit 604 are on. FET 704 is off. This pulls RSDEC 216 low. With ENABLE high and RSDEC 216 low, FETs 710-711 are off and FET 708 of data path circuit 602 is on. FETs 702-703 are also off. When the read data signal on bit line 106 is low, FET 707 is on and FET 709 is off, which charges MX 214 to peripheral voltage 210. FET 304 and FET 311 of output circuit 206 (see FIG. 2) invert MX 214 to set OUTPUT 122 low. When the read signal on bit line 106 is high, FET 707 is off or partially off. FET 709 is on, which discharges MX 214 to ground 212. FET 304 and FET 311 of output circuit 206 invert MX 214 to set OUTPUT 122 high.

What is claimed is:

1. A Static Random Access Memory (SRAM) device, comprising:
 a memory cell array;
 a bit line traversing the memory cell array for reading data from memory cells of the memory cell array;
 a read circuit coupled to the bit line for translating data stored in a memory cell from a cell voltage of the memory cells to a peripheral voltage of an output of the SRAM device, wherein the cell voltage and the peripheral voltage share a common ground, the read circuit comprising:
  a data path circuit configured to toggle a first internal signal between a logical zero of the peripheral voltage and a logical one of the peripheral voltage based on read data on the bit line and a second internal signal, and to toggle a third internal signal between a logical zero of the cell voltage and a logical one of the cell voltage based on an enable signal and the read data on the bit line;
  a level shifter circuit configured to toggle the second internal signal between a logical zero of the peripheral voltage and a logical one of the peripheral voltage based on the third internal signal and a reset signal; and
  an output driver circuit configured to toggle the output of the SRAM device between a logical zero of the peripheral voltage and a logical one of the peripheral voltage based on the first internal signal.

2. The SRAM device of claim 1 wherein the data path circuit comprises:
 a first P-channel Field Effect Transistor (FET) having a source terminal coupled to the peripheral voltage, a gate terminal coupled to the bit line, and a drain terminal;
 a second P-channel FET having a source terminal coupled to the drain terminal of the first FET, a gate terminal coupled to the second internal signal, and a drain terminal coupled to the first internal signal; and
 a third N-channel FET having a drain terminal coupled to the first internal signal, a gate terminal coupled to the bit line, and a source terminal coupled to the common ground.

3. The SRAM device of claim 2 wherein the data path circuit further comprises:
 an inverter having a supply terminal coupled to the cell voltage, a ground terminal coupled to the common ground, an input coupled to the bit line, and an output terminal; and
 a NAND gate having a supply terminal coupled to the cell voltage, a ground terminal coupled to the common ground, a first input terminal coupled to the output terminal of the inverter, a second input terminal coupled to the enable signal, and an output terminal coupled to the third internal signal.

4. The SRAM device of claim 3 wherein the data path circuit further comprises:
 a fourth N-channel FET having a drain terminal coupled to the bit line, a gate terminal coupled to a compliment of the enable signal, and a source terminal coupled to the common ground.

5. The SRAM device of claim 1 wherein the output circuit comprises:
 a first P-channel Field Effect Transistor (FET) having a source terminal coupled to the peripheral voltage, a gate terminal coupled to the first internal signal, and a drain terminal coupled to the output of the SRAM device; and
 a second N-channel FET having a drain terminal coupled to the output of the SRAM device, a gate terminal coupled to the first internal signal, and a source terminal coupled to the common ground.

6. The SRAM device of claim 1 wherein the level shifter circuit comprises:
   a first P-channel Field Effect Transistor (FET) having a source terminal coupled to the peripheral voltage, a gate terminal coupled to the second internal signal, and a drain terminal;
   a second P-channel FET having a source terminal coupled to the drain terminal of the first FET, a gate terminal coupled to the third internal signal, and a drain terminal;
   a third N-channel FET having a drain terminal coupled to the drain terminal of the second FET, a gate terminal coupled to the third internal signal, and a source terminal coupled to the common ground;
   a fourth N-channel FET having a drain terminal coupled to the drain terminal of the third FET, a gate terminal coupled to the second internal signal, and a source terminal coupled to the common ground;
   a fifth P-channel FET having a source terminal coupled to the peripheral voltage, a gate terminal, and a drain terminal;
   a sixth P-channel FET having a source terminal coupled to the drain terminal of the fifth FET, a gate terminal coupled to the drain terminal of the fourth FET, and a drain terminal coupled to the second internal signal;
   a seventh N-channel FET having a drain terminal coupled to the second internal signal, a gate terminal coupled to the reset signal, and a source terminal;
   an eighth N-channel FET having a drain terminal coupled to the source terminal of the seventh FET, a gate terminal coupled to the gate terminal of the fifth FET, and a source terminal coupled to the common ground;
   a ninth P-channel FET having a source terminal coupled to the peripheral voltage, a gate terminal coupled to the reset signal, and a drain terminal coupled to the second internal signal; and
   an inverter having a supply terminal coupled to the cell voltage, a ground terminal coupled to the common ground, an input terminal coupled to the third internal signal, and an output terminal coupled to the gate terminal of the eighth FET.

7. A Static Random Access Memory (SRAM) device, comprising:
   a memory cell array;
   a bit line traversing the memory cell array for reading data from memory cells of the memory cell array;
   a read circuit coupled to the bit line for translating data stored in a memory cell from a cell voltage of the memory cells to a peripheral voltage of an output of the SRAM device, wherein the cell voltage and the peripheral voltage share a common ground, the read circuit comprising:
      a data path circuit configured to toggle a first internal signal between a logical zero of the peripheral voltage and a logical one of the peripheral voltage based on read data on the bit line and a second internal signal, and to set the bit line to a logical zero based on the second internal signal and a compliment of an enable signal;
      a level shifter circuit configured to toggle the second internal signal between a logical zero of the peripheral voltage and a logical one of the peripheral voltage based on the enable signal and a reset signal; and
      an output driver circuit configured to toggle the output of the SRAM device between a logical zero of the peripheral voltage and a logical one of the peripheral voltage based on the first internal signal.

8. The SRAM device of claim 7 wherein the data path circuit comprises:
   a first P-channel Field Effect Transistor (FET) having a source terminal coupled to the peripheral voltage, a gate terminal coupled to the bit line, and a drain terminal;
   a second P-channel FET having a source terminal coupled to the drain terminal of the first FET, a gate terminal coupled to the second internal signal, and a drain terminal coupled to the first internal signal; and
   a third N-channel FET having a drain terminal coupled to the first internal signal, a gate terminal coupled to the bit line, and a source terminal coupled to the common ground.

9. The SRAM device of claim 8 wherein the data path circuit further comprises:
   a third N-channel FET having a drain terminal coupled to the bit line, a gate terminal coupled to the second internal signal, and a source terminal; and
   a fourth N-channel FET having a drain terminal coupled to the source terminal of the third FET, a gate terminal coupled the compliment of the enable signal, and a source terminal coupled to the common ground.

10. The SRAM device of claim 7 wherein the level shifter circuit comprises:
   a first P-channel Field Effect Transistor (FET) having a source terminal coupled to the peripheral voltage, a gate terminal coupled to the reset signal, and a drain terminal coupled to the second internal signal;
   a second N-channel FET having a drain terminal coupled to the second internal signal, a gate terminal coupled to the reset signal, and a source terminal;
   a third N-channel FET having a drain terminal coupled to the source terminal of the second FET, a gate terminal coupled to the enable signal, and a source terminal coupled to the common ground;
   a fourth P-channel FET having a source terminal coupled to the peripheral voltage, a gate terminal coupled to the enable signal, and a drain terminal;
   a fifth P-channel FET having a source terminal coupled to the drain terminal of the fourth FET, a gate terminal, and a drain terminal coupled to the second internal signal; and
   an inverter having a supply terminal coupled to the peripheral voltage, a ground terminal coupled to the common ground, an input terminal coupled to the second internal signal, and an output terminal coupled to the gate terminal of the fifth FET.

11. The SRAM device of claim 7 wherein the output circuit comprises:
   a first P-channel Field Effect Transistor (FET) having a source terminal coupled to the peripheral voltage, a gate terminal coupled to the first internal signal, and a drain terminal coupled to the output of the SRAM device; and
   a second N-channel FET having a drain terminal coupled to the output of the SRAM device, a gate terminal coupled to the first internal signal, and a source terminal coupled to the common ground.

* * * * *